US009122170B2

(12) United States Patent
Kita

(10) Patent No.: US 9,122,170 B2
(45) Date of Patent: Sep. 1, 2015

(54) TRANSMISSION OPTICAL SYSTEM, ILLUMINATION OPTICAL SYSTEM, EXPOSURE APPARATUS, AND DEVICE MANUFACTURING METHOD

(75) Inventor: Naonori Kita, Saitama (JP)

(73) Assignee: NIKON CORPORATION, Tokyo (JP)

( * ) Notice: Subject to any disclaimer, the term of this patent is extended or adjusted under 35 U.S.C. 154(b) by 738 days.

(21) Appl. No.: 13/196,535

(22) Filed: Aug. 2, 2011

(65) Prior Publication Data

US 2012/0028197 A1    Feb. 2, 2012

(30) Foreign Application Priority Data

Aug. 2, 2010 (JP) ................... 2010-173240

(51) Int. Cl.
*G03F 7/20* (2006.01)

(52) U.S. Cl.
CPC ........ *G03F 7/70158* (2013.01); *G03F 7/70058* (2013.01)

(58) Field of Classification Search
CPC .......... G03F 7/70158; G03F 7/700058; G03F 7/700075; G03F 7/70715
USPC .......................................................... 355/67
See application file for complete search history.

(56) References Cited

U.S. PATENT DOCUMENTS

| 5,731,577 | A | 3/1998 | Tanitsu | |
|---|---|---|---|---|
| 5,850,300 | A | 12/1998 | Kathman et al. | |
| 6,624,880 | B2* | 9/2003 | Sandstrom et al. | 355/71 |
| 6,913,373 | B2 | 7/2005 | Tanaka et al. | |
| 2002/0089654 | A1* | 7/2002 | Ota et al. | 355/67 |
| 2003/0227684 | A1* | 12/2003 | Goto | 359/566 |
| 2005/0254033 | A1* | 11/2005 | Toyoda | 355/67 |
| 2006/0170901 | A1 | 8/2006 | Tanitsu et al. | |
| 2007/0146676 | A1 | 6/2007 | Tanitsu et al. | |
| 2007/0229957 | A1* | 10/2007 | Sogard | 359/584 |
| 2007/0296936 | A1 | 12/2007 | Kato et al. | |
| 2008/0074746 | A1 | 3/2008 | Cumme | |

(Continued)

FOREIGN PATENT DOCUMENTS

| JP | A-02-210813 | 8/1990 |
|---|---|---|
| JP | A-02-237012 | 9/1990 |

(Continued)

OTHER PUBLICATIONS

International Search Report issued in International Application No. PCT/JP2011/065806 Dated Oct. 11, 2011 (with trans).

(Continued)

*Primary Examiner* — Peter B Kim
*Assistant Examiner* — Michelle Iacoletti
(74) *Attorney, Agent, or Firm* — Oliff PLC

(57) ABSTRACT

According to one embodiment, a transmission optical system which guides light in a nearly parallel beam state emitted from an optical outlet port of a light source, to an optical inlet port of an exposure apparatus body and which injects the light in the nearly parallel beam state into the optical inlet port is provided with a condensing optical system which keeps the optical outlet port and the optical inlet port in an optical Fourier transform relation, and an angle distribution providing element which is arranged in an optical path between the optical outlet port and the condensing optical system and which provides an emergent beam with an angle distribution in a range larger than a range of an angle distribution of an incident beam.

12 Claims, 13 Drawing Sheets

(56) References Cited

U.S. PATENT DOCUMENTS

| 2008/0259304 | A1* | 10/2008 | Dierichs | 355/67 |
| 2009/0073411 | A1 | 3/2009 | Tanitsu | |
| 2009/0185156 | A1* | 7/2009 | Kudo et al. | 355/71 |
| 2010/0060873 | A1* | 3/2010 | Deguenther et al. | 355/66 |

FOREIGN PATENT DOCUMENTS

| JP | A-06-124873 | 5/1994 |
| JP | A-10-209044 | 8/1998 |
| JP | A-10-303114 | 11/1998 |
| JP | A-2010-161246 | 7/2010 |
| WO | WO99/49504 A1 | 9/1999 |
| WO | WO 2010/041522 A1 | 4/2010 |

OTHER PUBLICATIONS

International Preliminary Report on Patentability issued in International Patent Application No. PCT/JP2011/065806 dated Feb. 5, 2013.

* cited by examiner

TRANSMISSION OPTICAL SYSTEM, ILLUMINATION OPTICAL SYSTEM, EXPOSURE APPARATUS, AND DEVICE MANUFACTURING METHOD

BACKGROUND

1. Field

One embodiment relates to a transmission optical system, an illumination optical system, an exposure apparatus, and a device manufacturing method. More particularly, one embodiment relates to a transmission optical system suitably applicable to an illumination optical system of an exposure apparatus for manufacturing devices such as semiconductor devices, imaging devices, liquid crystal display devices, and thin film magnetic heads by the lithography process.

2. Description of the Related Art

The main body of the exposure apparatus of this type is a considerably large device in whole and the required floor area for installation thereof is large. Furthermore, a light source used to supply exposure light (illumination light) to the exposure apparatus is, for example, a KrF excimer laser light source or an ArF excimer laser light source and the excimer laser light source is also a considerably large device. It is therefore often the case that the light source device is arranged with some distance from the exposure apparatus body, in the case of the exposure apparatus using the excimer laser light source.

There is then a proposed transmission optical system including a relay lens system and a plurality of plane reflecting mirrors, as an optical system for guiding the light emitted from an optical outlet port of the excimer laser light source, to an optical inlet port of the exposure apparatus body (e.g., cf. U.S. Pat. No. 5,731,577). This transmission optical system guides the light in a nearly parallel beam state emitted from the light source, to the exposure apparatus body and injects the light in the nearly parallel beam state into the exposure apparatus body.

SUMMARY

According to one embodiment, a transmission optical system which guides light in a nearly parallel beam state emitted from an optical outlet port of a light source, to an optical inlet port of an exposure apparatus body and which injects the light in the nearly parallel beam state into the optical inlet port, comprising:

a splitting element which is arranged in an optical path between the optical outlet port and the optical inlet port and which splits an incident beam in mutually different directions, a plurality of beams, split in the mutually different directions by the splitting element, overlapping only in part thereof on a predetermined plane near the optical inlet port.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings.

Figure 1:
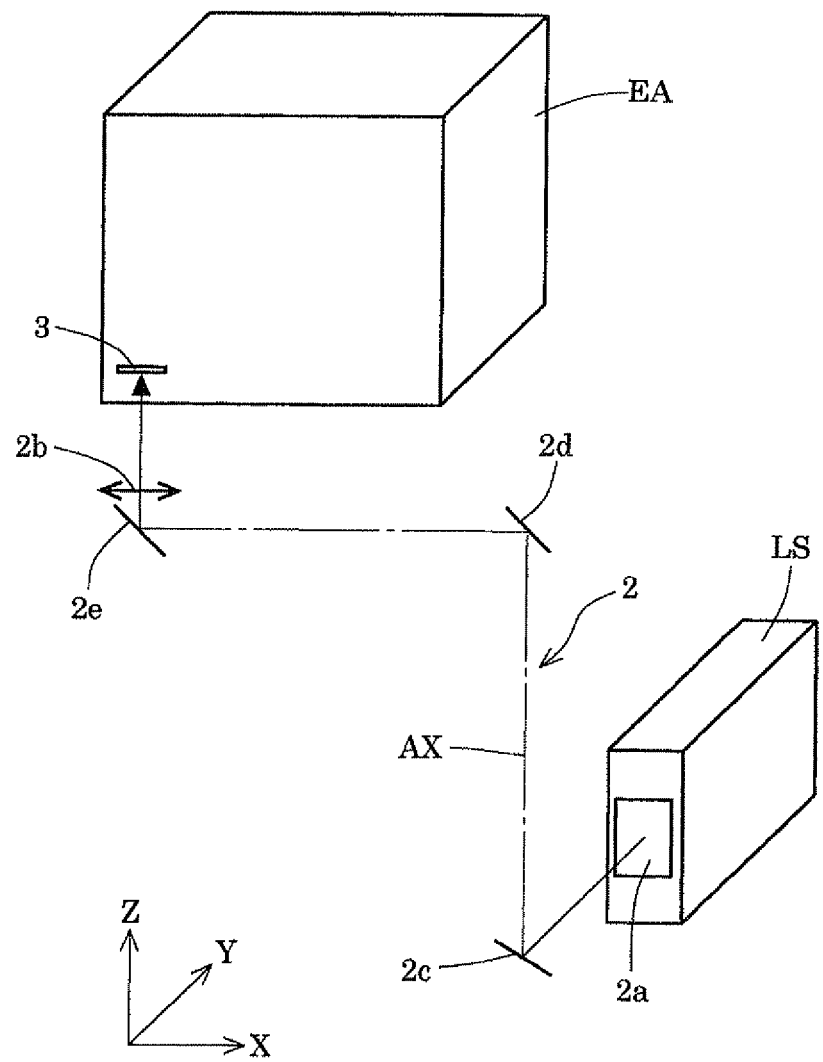
FIG. 1 is an exemplary drawing schematically showing an overall configuration of an exposure apparatus according to an embodiment.
Figure 2:
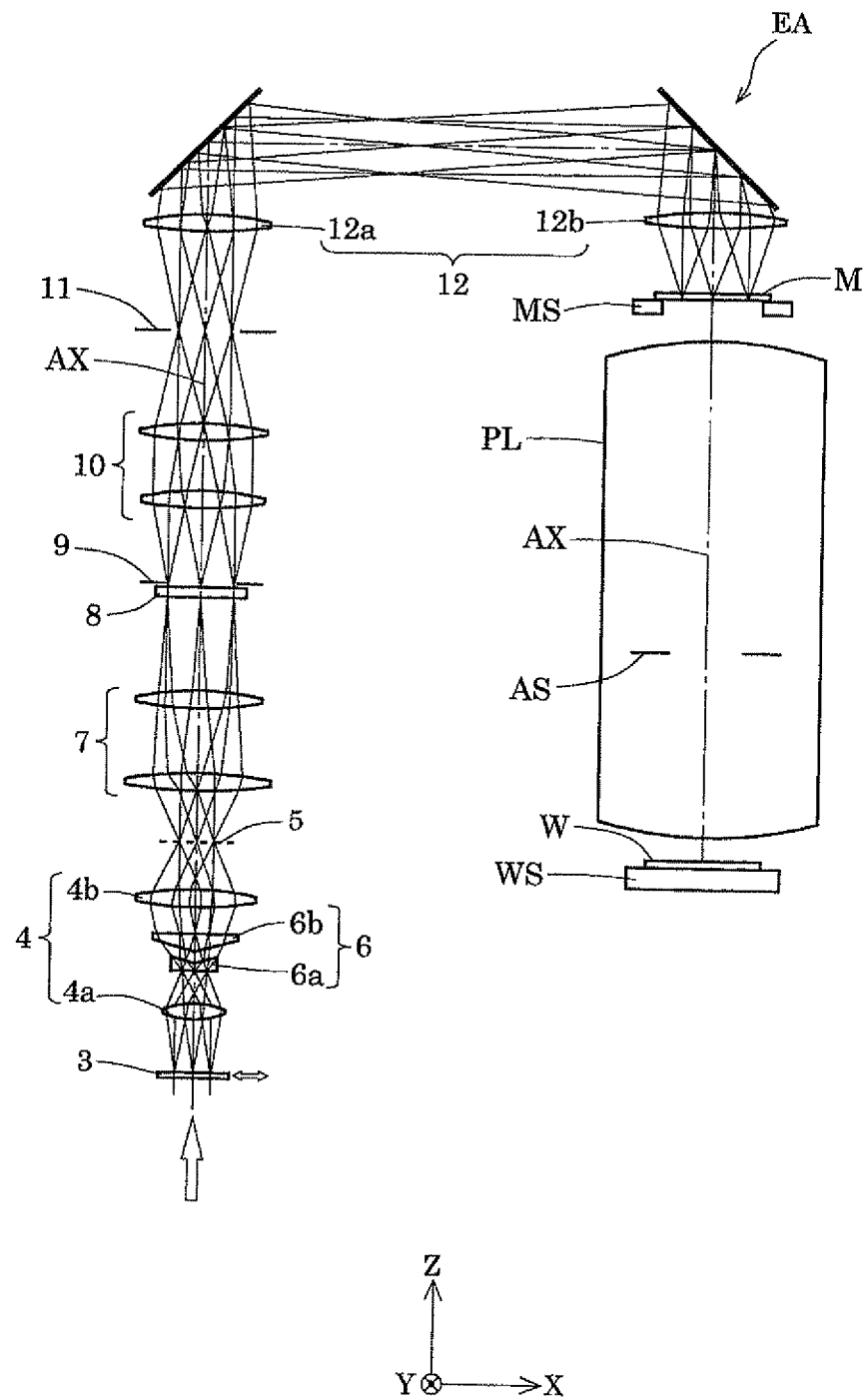
FIG. 2 is an exemplary drawing schematically showing an internal configuration of an exposure apparatus body shown in FIG. 1.

FIG. 1 is an exemplary drawing schematically showing an overall configuration of an exposure apparatus according to an embodiment. FIG. 2 is an exemplary drawing schematically showing an internal configuration of an exposure apparatus body. In FIG. 2, the Z-axis is set along a direction of a normal to an exposure surface (transfer surface) of a wafer W being a photosensitive substrate, the X-axis along a direction parallel to the plane of FIG. 2 in the exposure surface of the wafer W, and the Y-axis along a direction perpendicular to the plane of FIG. 2 in the exposure surface of the wafer W.

With reference to FIG. 1, exposure light (illumination light) is supplied from a light source LS in the exposure apparatus of the present embodiment. The light source LS applicable herein can be, for example, an ArF excimer laser light source to supply light at the wavelength of 193 nm or a KrF excimer laser light source to supply light at the wavelength of 248 nm. A beam with a cross section of a rectangular shape (rectangular shape having one sides along the X-direction and the other sides along the Z-direction) emitted along the negative Y-direction from the light source LS travels via a diffraction optical element 2a to impinge upon a first mirror 2c.

The diffraction optical element 2a is located at a position just behind an optical outlet port of the laser light source LS. The beam deflected into the positive Z-direction by the first mirror 2c is reflected into the negative X-direction by a second mirror 2d and then is incident to a third mirror 2e. The beam deflected into the positive Z-direction by the third mirror 2e travels via a condensing optical system 2b to enter a diffraction optical element 3 arranged at an optical inlet port of an exposure apparatus body EA. The diffraction optical element 3, as described below, functions as a spatial light modulating element to spatially modulate incident light so as to form a pupil intensity distribution, and emit the thus modulated light.

It is assumed in the present embodiment that the Z-direction corresponds to the vertical direction and that the exposure apparatus body EA is installed upstairs above the laser light source LS. In this manner, the diffraction optical element 2a, condensing optical system 2b, and three path bending mirrors 2c-2e constitute a transmission optical system 2 which guides the light in a nearly parallel beam state emitted from the optical outlet port of the laser light source LS, to the optical inlet port of the exposure apparatus body EA and injects the light in the nearly parallel beam state into the optical inlet port. The specific configuration and action of the transmission optical system 2 will be described later.

With reference to FIG. 2, the light having traveled via the diffraction optical element 3 is incident into an afocal lens 4. The afocal lens 4 is composed of a front lens unit 4a and a rear lens unit 4b and is an afocal system (afocal optic) which is so set that the front focal position of the front lens unit 4a approximately coincides with the position of the diffraction optical element 3 and that the rear focal position of the rear lens unit 4b approximately coincides with a position of a predetermined plane 5 indicated by a dashed line in the drawing. The diffraction optical element 3 is constructed by forming blocks having the pitch nearly equal to the wavelength of the exposure light (illumination light), in a substrate, and has an action to diffract an incident beam at desired angles. It is assumed hereinafter for easier description that the diffraction optical element 3 is one for annular illumination.

The diffraction optical element 3 for annular illumination functions in such a manner that when a parallel beam with a rectangular cross section is incident thereinto, it forms an annular light intensity distribution in the far field (or Fraunhofer diffraction region). Therefore, the nearly parallel beam incident into the diffraction optical element 3 forms an annular light intensity distribution 21 on a pupil plane of the afocal lens 4 and is then emitted in an annular angle distribution from the afocal lens 4. A conical axicon system 6 is arranged at or near the pupil position of the afocal lens 4. The configuration and action of the conical axicon system 6 will be described later.

The light passing through the afocal lens 4 travels through a zoom lens 7 for varying the σ value (σ value=mask-side numerical aperture of the illumination optical system/mask-side numerical aperture of the projection optical system), to enter a micro fly's eye lens (or fly's eye lens) 8 as an optical integrator. The micro fly's eye lens 8 is, for example, an optical element consisting of a large number of microscopic lenses with a positive refracting power arranged lengthwise and crosswise and densely, and is constructed by forming the microscopic lens group in a plane-parallel plate by etching.

Each microscopic lens forming the micro fly's eye lens is smaller than each lens element forming the fly's eye lens. In the micro fly's eye lens, different from the fly's eye lens consisting of lens elements isolated from each other, the large number of microscopic lenses (microscopic refracting faces) are integrally formed without being isolated from each other. However, the micro fly's eye lens is an optical integrator of the same wavefront division type as the fly's eye lens in that the lens elements with the positive refracting power are arranged lengthwise and crosswise. It is also possible to use, for example, a cylindrical micro fly's eye lens as the micro fly's eye lens 8. The configuration and action of the cylindrical micro fly's eye lens are disclosed, for example, in U.S. Pat. No. 6,913,373. The teachings of U.S. Pat. No. 6,913,373 are incorporated herein by reference.

The position of the predetermined plane 5 is arranged at or near the front focal position of the zoom lens 7 and an entrance surface of the micro fly's eye lens 8 is arranged at or near the rear focal position of the zoom lens 7. In other words, the zoom lens 7 arranges the predetermined plane 5 and the entrance surface of the micro fly's eye lens 8 substantially in a Fourier transform relation and, in turn, arranges the pupil plane of the afocal lens 4 and the entrance surface of the micro fly's eye lens 8 substantially optically conjugate with each other.

Therefore, for example, an annular illumination field centered on the optical axis AX is formed on the entrance surface of the micro fly's eye lens 8 as on the pupil plane of the afocal lens 4. The overall shape of this annular illumination field varies in a similarity relation depending upon the focal length of the zoom lens 7. The beam incident into the micro fly's eye lens 8 is divided two-dimensionally to form a secondary light source with a light intensity distribution substantially identical to the illumination field formed on the entrance surface of the micro fly's eye lens 8, i.e., a secondary light source (pupil intensity distribution) consisting of a substantial surface illuminant of an annular shape centered on the optical axis AX, at a rear focal plane of the micro fly's eye lens 8 or at a position near it.

An illumination aperture stop 9 having an annular aperture (light transmitting portion) corresponding to the annular secondary light source is arranged, if necessary, at or near the rear focal plane of the micro fly's eye lens 8. The illumination aperture stop 9 is configured so as to be freely inserted into or retracted from the illumination optical path and so as to be interchangeable with a plurality of aperture stops having apertures of different sizes and shapes. An aperture stop switching method applicable herein can be, for example, the well-known turret method or slide method. The illumination aperture stop 9 is arranged at a position substantially optically conjugate with an entrance pupil plane of projection optical system PL and defines a range of contribution of the secondary light source to illumination.

The light having traveled through the micro fly's eye lens 8 and the illumination aperture stop 9 travels through a condenser optical system 10 to illuminate a mask blind 11 in a superimposed manner. In this way, a rectangular illumination field according to the shape and focal length of the microscopic lenses of the micro fly's eye lens 8 is formed on the mask blind 11 as an illumination field stop. The light having traveled through a rectangular aperture (light transmitting portion) of the mask blind 11 travels via an imaging optical system 12 consisting of a front lens unit 12a and a rear lens unit 12b, to illuminate a mask M on which a predetermined pattern is formed, in a superimposed manner. Namely, the imaging optical system 12 forms an image of the rectangular aperture of the mask blind 11 on the mask M.

The pattern to be transferred is formed on the mask M held on a mask stage MS. The light passing through the pattern of the mask M travels through the projection optical system PL to form an image of the mask pattern on the wafer (photosensitive substrate) W held on a wafer stage WS. In this way, the pattern of the mask M is sequentially exposed in each exposure region on the wafer W by full-shot exposure or by scan exposure with two-dimensional drive and control of the wafer W in a plane (XY plane) perpendicular to the optical axis AX of the projection optical system PL.

The conical axicon system 6 is composed of, in order from the light source side, a first prism member 6a with a plane on the light source side and a refracting surface of a concave conical shape on the mask side, and a second prism member 6b with a plane on the mask side and a refracting surface of a convex conical shape on the light source side. The refracting surface of the concave conical shape of the first prism member 6a and the refracting surface of the convex conical shape of the second prism member 6b are formed in such a complementary relation as to be able to abut each other. At least one of the first prism member 6a and the second prism member 6b is configured to be movable along the optical axis AX so that the spacing between the first prism member 6a and the second prism member 6b can vary.

In a state in which the first prism member 6a and the second prism member 6b abut each other, the conical axicon system 6 functions as a plane-parallel plate to cause no effect on the annular secondary light source formed. However, as the first prism member 6a and the second prism member 6b are separated away from each other, the outside diameter (inside diameter) of the annular secondary light source varies while the width of the annular secondary light source (half of the difference between the outside diameter and the inside diameter of the annular secondary light source) is kept constant. Namely, the annular ratio (inside diameter/outside diameter) and the size (outside diameter) of the annular secondary light source vary.

The zoom lens 7 functions to enlarge or reduce the overall shape of the annular secondary light source in a similarity relation. For example, when the focal length of the zoom lens 7 is increased from a minimum to a predetermined value, the overall shape of the annular secondary light source is increased in a similarity relation. In other words, the width and size (outside diameter) of the secondary light source both vary without change in the annular ratio of the annular secondary light source, by the action of the zoom lens 7. In this manner, the annular ratio and size (outside diameter) of the annular secondary light source can be controlled by the actions of the conical axicon system 6 and the zoom lens 7.

In the present embodiment, as described above, the mask M arranged on the illumination target surface of the illumination optical system (2-12) is illuminated by Köhler illumination using the secondary light source formed by the micro fly's eye lens 8, as a light source. For this reason, the position where the secondary light source is formed is optically conjugate with the position of the aperture stop AS of the projection optical system PL and the plane where the secondary light source is formed can be called an illumination pupil plane of the illumination optical system (2-12). Typically, the illumination target surface (the surface where the mask M is arranged, or the surface where the wafer W is arranged if the illumination optical system is considered to include the projection optical system PL) is an optical Fourier transform plane with respect to the illumination pupil plane.

A pupil intensity distribution is a light intensity distribution (luminance distribution) on the illumination pupil plane of the illumination optical system (2-12) or on a plane optically conjugate with the illumination pupil plane. When the number of wavefront divisions by the micro fly's eye lens 8 is relatively large, the global light intensity distribution formed on the entrance plane of the micro fly's eye lens 8 demonstrates a high correlation with the global light intensity distribution (pupil intensity distribution) of the entire secondary light source. For this reason, the light intensity distributions on the entrance plane of the micro fly's eye lens 8 and on a plane optically conjugate with the entrance place can also be called pupil intensity distributions.

If a diffraction optical element for multi-polar illumination (dipolar illumination, quadrupolar illumination, octupolar illumination, or the like) (not shown) is set instead of the diffraction optical element 3 for annular illumination in the illumination optical path, multi-polar illumination can be implemented. The diffraction optical element for multi-polar illumination functions in such a manner that when a parallel beam with a rectangular cross section is incident thereinto, it forms a light intensity distribution of a multi-polar shape (dipolar, quadrupolar, octupolar, or other shape) in the far field. Therefore, beams having traveled via the diffraction optical element for multi-polar illumination form an illumination field of a multi-polar shape, for example, consisting of a plurality of illumination zones of a predetermined shape (arcuate, circular, or other shape) centered on the optical axis AX on the entrance plane of the micro fly's eye lens 8. As a result, the secondary light source of the same multi-polar shape as the illumination field formed on the entrance plane of the micro fly's eye lens 8 is also formed at or near the rear focal plane of the micro fly's eye lens 8.

If a diffraction optical element for circular illumination (not shown) is set instead of the diffraction optical element 3 for annular illumination in the illumination optical path, ordinary circular illumination can be implemented. The diffraction optical element for circular illumination functions in such a manner that when a parallel beam with a rectangular cross section is incident thereinto, it forms a light intensity distribution of a circular shape in the far field. Therefore, a beam having traveled via the diffraction optical element for circular illumination forms, for example, an illumination field of a circular shape centered on the optical axis AX on the entrance plane of the micro fly's eye lens 8. As a result, the secondary light source of the same circular shape as the illumination field formed on the entrance plane is also formed at or near the rear focal plane of the micro fly's eye lens 8. Such diffraction optical elements are disclosed, for example, in U.S. Pat. No. 5,850,300 and U.S. Patent Application Laid-Open No. 2008/0074746. If a diffraction optical element with an appropriate property (not shown) is set instead of the diffraction optical element 3 for annular illumination in the illumination optical path, modified illumination of any one of various forms can be implemented. A switching method of the diffraction optical element 3 applicable herein can be, for example, the well-known turret method or slide method. The teachings of U.S. Pat. No. 5,850,300 and U.S. Patent Application Laid-Open No. 2008/0074746 are incorporated herein by reference.

Figure 3:
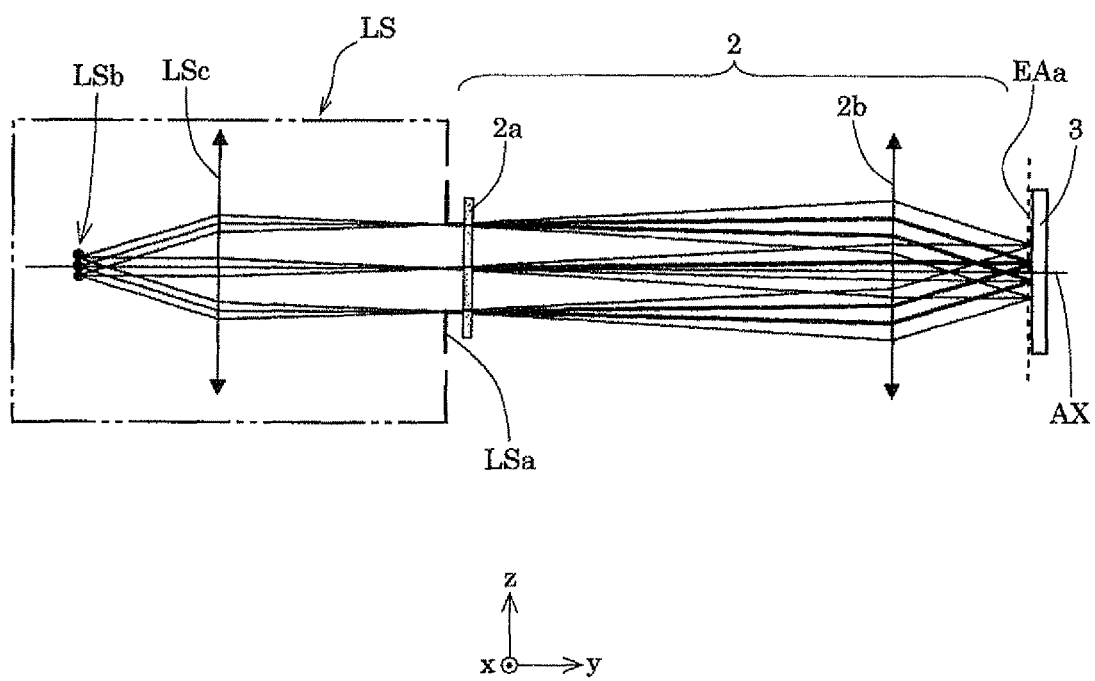
FIG. 3 is an exemplary drawing schematically showing a configuration of a transmission optical system according to an embodiment.

FIG. 3 is an exemplary drawing schematically showing the configuration of the transmission optical system according to the present embodiment. FIG. 3 is drawn without illustration of the path bending mirrors 2c-2e arranged between the diffraction optical element 2a and the condensing optical system 2b and the optical path between the laser light source LS and the diffraction optical element 3 is developed into a linear form along the optical axis AX of the illumination optical system. In FIG. 3, the y-axis is set along the direction of the optical axis AX extending linearly, the z-axis in parallel with the plane of FIG. 3 in a plane perpendicular to the y-axis, and the x-axis perpendicularly to the plane of FIG. 3 in the plane perpendicular to the y-axis.

In the transmission optical system 2 of the present embodiment, the diffraction optical element 2a is arranged at the position just behind the optical outlet port LSa of the laser light source LS. The condensing optical system 2b is arranged so that its rear focal position approximately coincides with the optical inlet port EAa of the exposure apparatus body EA. In other words, the condensing optical system 2b is, for example, a Fourier optical system which is arranged at the position relatively close to the optical inlet port EAa and which keeps the optical outlet port LSa and the optical inlet port EAa substantially in an optical Fourier transform relation. As a consequence, the diffraction optical element 2a and the optical inlet port EAa are substantially in an optical Fourier transform relation.

Figure 4:
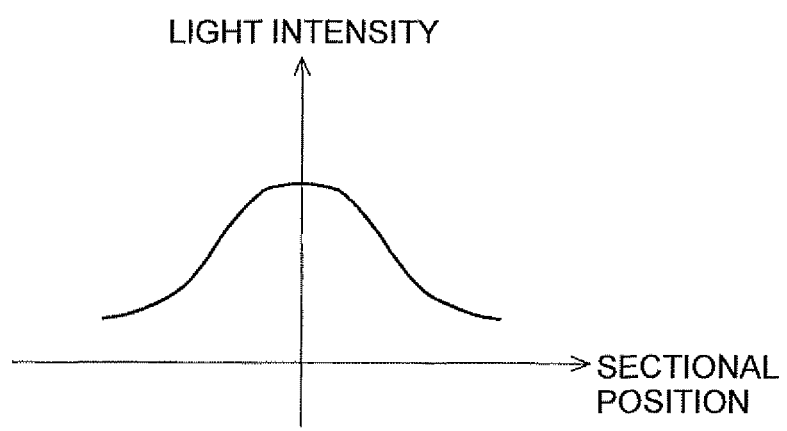
FIG. 4 is an exemplary drawing schematically showing a light intensity distribution of a beam emitted from a light source.

It is assumed hereinafter that the beam emitted from the optical outlet port LSa of the laser light source LS, e.g., like an excimer laser light source is a nearly parallel beam with a very small angle of divergence and has a rectangular cross section with long sides along the x-direction and short sides along the z-direction. In this case, the z-direction being the short-side direction corresponds to a short-side direction of a rectangular illumination region formed on the mask M and therefore corresponds to a short-side direction of a rectangular still exposure region formed on the wafer W. The beam emitted from the optical outlet port LSa, as schematically shown in FIG. 4, has a Gaussian-like intensity distribution in which the light intensity (energy density) is the highest in a central region of its cross section and the light intensity gradually decreases toward its peripheral region.

With reference to FIG. 3, the internal configuration of the laser light source LS is optically modeled by an imaginary surface illuminant LSb and an imaginary positive lens LSc. Namely, it can be optically assumed that in the laser light source LS, the beam from the imaginary surface illuminant LSb is subjected to the condensing action of the imaginary positive lens LSc to become a nearly parallel beam with a very small angle of divergence to be emitted from the optical outlet port LSa. In this case, the imaginary surface illuminant LSb in the laser light source LS is substantially optically conjugate with the optical inlet port EAa where the diffraction optical element 3 is arranged. Furthermore, the imaginary surface illuminant LSb and the optical outlet port LSa (and, therefore, the diffraction optical element 2a) are substantially in an optical Fourier transform relation. Then the beam emitted from the imaginary surface illuminant LSb has a Gaussian-like intensity distribution as the emerging beam from the optical outlet port LSa does.

Figure 5:
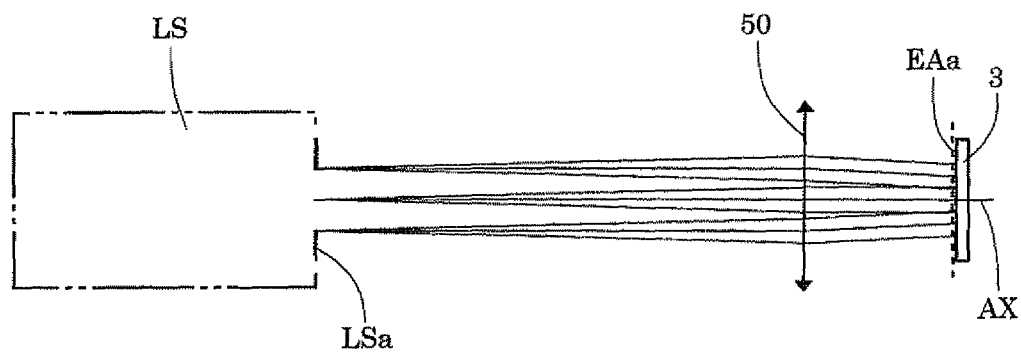
FIG. 5 is an exemplary drawing schematically showing a configuration of a transmission optical system according to a comparative example.

In a transmission optical system of a comparative example shown in FIG. 5, according to the conventional technology, a nearly parallel beam emitted from the optical outlet port LSa of the laser light source is shaped into a required size by the condensing action of a positive lens 50 with a small refracting power arranged at a position relatively near to the optical inlet port EAa of the exposure apparatus body and the thus shaped beam is injected into the optical inlet port EAa. In this case, the beam incident into the optical inlet port EAa has a Gaussian-like intensity distribution as the emerging beam from the optical outlet port LSa does.

As a result, in the configuration of the comparative example shown in FIG. 5, the diffraction optical element 3 arranged at the optical inlet port EAa of the exposure apparatus body and made, for example, of quartz is likely to be partially damaged by irradiation with the light having the high energy density in the central region of the incident beam. If the diffraction optical element 3 is damaged by the light irradiation, it becomes unfeasible to stably form a required pupil intensity distribution on the illumination pupil at or near the rear focal plane of the micro fly's eye lens 8 and, in turn, on the pupil plane of the projection optical system FL (at the position of the aperture stop AS) and therefore to stably realize a required illumination condition.

The transmission optical system 2 of the present embodiment, as described above, is provided with the condensing optical system 2b for keeping the optical outlet port LSa of the laser light source LS and the optical inlet port EAa of the exposure apparatus body EA in the optical Fourier transform relation, and the diffraction optical element 2a arranged at the position just behind the optical outlet port LSa and having the predetermined diffraction characteristic. The diffraction optical element 2a functions as an angle distribution providing element which provides the emergent beam with an angle distribution in a range larger than the range of the angle distribution of the incident beam. Specifically, the diffraction optical element 2a has, as shown in FIG. 6, the diffraction characteristic (divergence angle characteristic) to form a beam 21 with a cross section of a ring shape (elliptical thin-line shape which is oblong in the z-direction, as an example in FIG. 6), with incidence of a parallel beam having a rectangular cross section.

Figure 7:
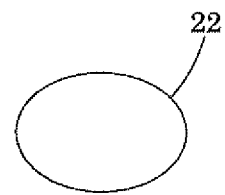
FIG. 7 is an exemplary drawing schematically showing a light intensity distribution of an emergent beam from an imaginary surface illuminant in the light source, by a single isointensity line.
Figure 7:
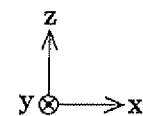

The emitted beam from the imaginary surface illuminant LSb in the laser light source LS is, for example, a beam with a Gaussian-like intensity distribution including an elliptical isointensity line 22 oblong in the x-direction, as schematically indicated by a single isointensity line in FIG. 7. Namely, the emitted beam from the imaginary surface illuminant LSb has a plurality of almost concentric elliptical isointensity lines, which are not illustrated in FIG. 7.

Figure 6:
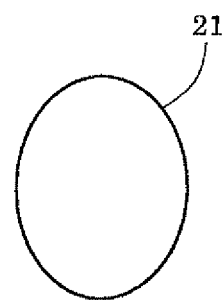
FIG. 6 is an exemplary drawing showing a diffraction characteristic of a diffraction optical element as an angle distribution providing element.
Figure 6:
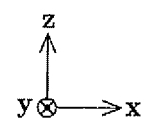
Figure 8:
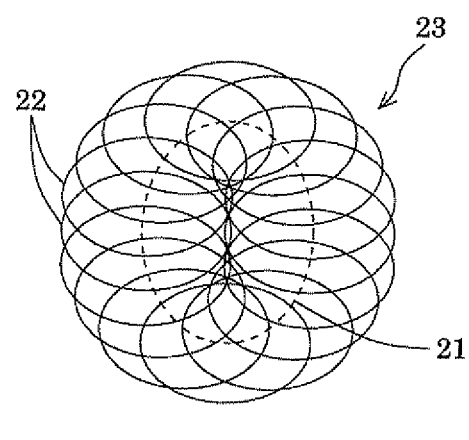
FIG. 8 is an exemplary drawing schematically showing a light intensity distribution of a beam arriving at an optical inlet port with the use of the diffraction optical element having the diffraction characteristic of FIG. 6.
Figure 8:
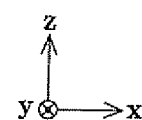

In this manner, the beam incident into the diffraction optical element 3 at the optical inlet port EAa through the diffraction optical element 2a and the condensing optical system 2b from the laser light source LS comes to have, as shown in FIG. 8, an intensity distribution 23 resulting from convolution of the Gaussian-like intensity distribution (cf. FIG. 7) of the emitted beam from the imaginary surface illuminant LSb in the laser light source LS and the far field distribution of the diffraction optical element 2a (cf. FIG. 6). Namely, the transmission optical system 2 injects the light with the intensity distribution 23 resulting from smoothing of the Gaussian-like intensity distribution of the light emitted from the laser light source LS, i.e., the light with the intensity distribution 23 like a top hat as a whole, into the diffraction optical element 3.

As described above, the transmission optical system 2 of the present embodiment is able to smooth the Gaussian-like intensity distribution of the light emitted from the laser light source LS and inject the resultant light into the optical inlet port EAa of the exposure apparatus body EA (and, in turn, into the diffraction optical element 3 arranged at the optical inlet port EAa), by cooperation of the diffraction optical element 2a with the predetermined diffraction characteristic arranged just behind the optical outlet port LSa and the condensing optical system 2b for keeping the optical outlet port LSa and the optical inlet port EAa in the optical Fourier transform relation.

The transmission optical system 2 of the present embodiment is provided with the diffraction optical element 2a arranged at the position just behind the optical outlet port LSa and having the predetermined diffraction characteristic. The diffraction optical element 2a functions as a splitting element which splits the incident beam into a plurality of beams in mutually different directions. At this time, the plurality of beams split into the mutually different directions by the splitting element overlap only in part thereof on a predetermined plane near the optical inlet port EAa. It is noted herein that installation of the condensing optical system 2b for keeping the optical outlet port LSa and the optical inlet port EAa in the optical Fourier transform relation can be omitted.

Since the illumination optical system (2-12) of the present embodiment employs the transmission optical system 2 for smoothing the intensity distribution of the light emitted from the laser light source LS and injecting the resultant light into the optical inlet port EAa of the exposure apparatus body EA, the diffraction optical element 3 as a spatial light modulating element arranged at the optical inlet port EAa is unlikely to be damaged by the light irradiation, thus achieving high durability. Since the exposure apparatus (2-WS) of the present embodiment employs the illumination optical system (2-12) with the high durability against the laser light source LS, e.g., like the excimer laser light source, it is able to stably perform exposure based on the required illumination condition.

Particularly, in the present embodiment, since the light with the intensity distribution 23 smoothed by the transmission optical system 2 is incident into the diffraction optical element 3, it is feasible not only to achieve the improvement in durability of the diffraction optical element 3 but also to well exhibit an averaging effect of diffraction actions of respective cells in the diffraction optical element 3. In the present embodiment, "smoothing" can refer to such an effect that the intensity distribution on the predetermined plane near the optical inlet port EAa, of the light emitted from the transmission optical system 2 has better uniformity than the intensity distribution in the plane crossing the traveling direction of the light incident into the transmission optical system 2.

Figure 9:
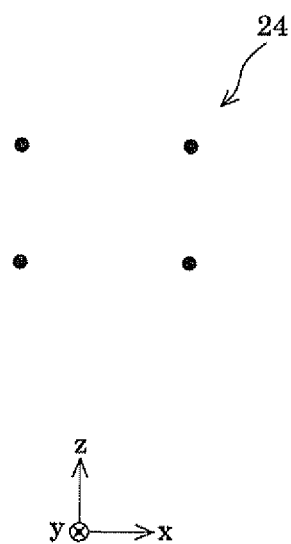
FIG. 9 is an exemplary drawing showing a diffraction characteristic of another diffraction optical element as an angle distribution providing element.

In the above embodiment, the diffraction optical element 2a has the diffraction characteristic to form the beam 21 with the ring-shaped cross section in the far field. However, without having to be limited to this, various forms can be employed as to the diffraction characteristic of the diffraction optical element as an angle distribution providing element. For example, as shown in FIG. 9, it is also possible to adopt a modification example using as an angle distribution providing element a diffraction optical element with such a diffraction characteristic as to form beam 24 having a cross section of a multi-polar shape (a four-dot shape as an example in FIG. 9) in the far field, with incidence of a parallel beam having a rectangular cross section.

Figure 10:
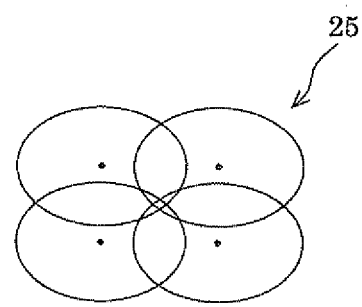
FIG. 10 is an exemplary drawing schematically showing a light intensity distribution of a beam arriving at the optical inlet port with the use of the diffraction optical element having the diffraction characteristic of FIG. 9.
Figure 10:
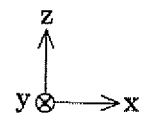

In this modification example, as shown in FIG. 10, a beam with an intensity distribution 25 resulting from convolution of the Gaussian-like intensity distribution of the emitted beam from the imaginary surface illuminant LSb in the laser light source LS (cf. FIG. 7) and the far field distribution of the diffraction optical element as an angle distribution providing element (cf. FIG. 9) is injected into the diffraction optical element 3. The intensity distribution 25 obtained by the convolution is a distribution resulting from smoothing of the Gaussian-like intensity distribution of the light emitted from the laser light source LS, i.e., a distribution like a top hat as a whole.

The above embodiment employs the diffraction optical element 2a arranged at the position just behind the optical outlet port LSa, as an angle distribution providing element for providing the emergent beam with the angle distribution in the range larger than the range of the angle distribution of the incident light. However, without having to be limited to this, various forms can be contemplated as to the arrangement, specific configuration, etc. of the angle distribution providing element. For example, the same effect as in the above embodiment can also be achieved by arranging the diffraction optical element as angle distribution providing element at an appropriate position in the optical path between the optical outlet port LSa of the laser light source LS and the condensing optical system 2b.

However, when the diffraction optical element as angle distribution providing element is arranged at the position just behind the optical outlet port, i.e., when the diffraction optical element and the optical inlet port are kept substantially in the optical Fourier transform relation, it becomes easier to implement the desired smoothing of the intensity distribution of the light emitted from the laser light source. It is also possible to use as the angle distribution providing element or as the splitting element, a refracting element such as a prism array or a cone lens, or a reflecting element such as a mirror array with the required divergence angle characteristic.

Figure 11:
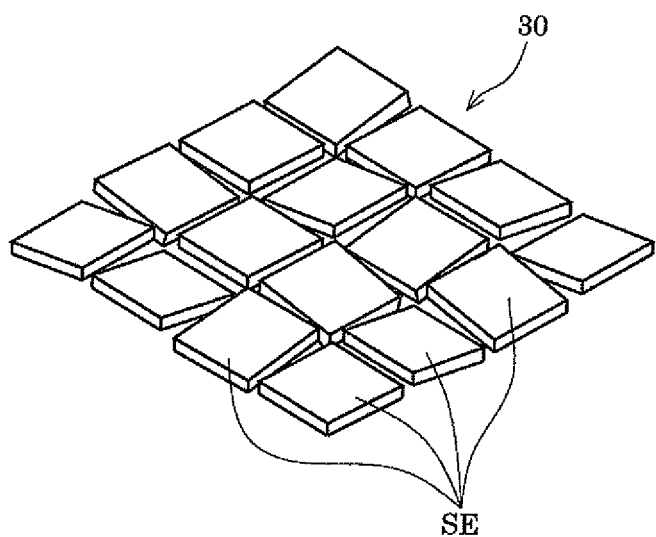
FIG. 11 is an exemplary drawing schematically showing a major configuration of a spatial light modulator composed of a plurality of microscopic element mirrors arranged in an array form and driven and controlled individually.

In the above embodiment, the diffraction optical element 3 is used as a spatial light modulating element which is arranged at the optical inlet port EAa of the exposure apparatus body EA and which spatially modulates and emits the incident light. However, without having to be limited to this, it is also possible to use a spatial light modulator with a plurality of optical elements arrayed along a predetermined plane and controlled individually. Namely, instead of the diffraction optical element 3 or in addition to the diffraction optical element 3, it is also possible to use a spatial light modulator 30 a major configuration of which is schematically shown, for example, in FIG. 11.

The spatial light modulator 30 is composed of a large number of microscopic element mirrors SE arranged in an array form and individually driven and controlled in their angle and direction of inclination, and divides the incident beam into microscopic units of respective reflecting faces so as to deflect divided beams, thereby converting the cross section of the beam into a desired shape or desired size. The illumination optical system using such a spatial light modulator is disclosed, for example, in U.S. Patent Application Laid-Open No. 2009/0073411. When the illumination optical system is constructed with the spatial light modulator 30 having the plurality of mirror elements SE arranged two-dimensionally and controlled individually, influence of damage to reflecting films of the respective mirror elements SE due to the light irradiation on the pupil intensity distribution (particularly, influence on uniformity of light intensity) is more serious than in the case of the diffraction optical element. The stability of control of the element mirrors SE can be improved by injecting the light with the intensity distribution smoothed by the transmission optical system 2, into the spatial light modulator 30. Furthermore, the pupil intensity distribution can be made stable in terms of time, for example, even in the case where the intensity distribution of the light from the laser light source LS, for example, like the excimer laser light source varies with time.

When a birefringent member used as a polarization controlling member, for example, is arranged near the spatial light modulating element arranged at the optical inlet port EAa of the exposure apparatus body EA and functioning to spatially modulate and emit the incident light, it is also feasible to improve stability of polarization control thereby. It is also feasible to reduce damage to the birefringent member due to the light irradiation.

In the aforementioned embodiment, the mask can be replaced with a variable pattern forming device for forming a predetermined pattern on the basis of predetermined electronic data. Use of this variable pattern forming device can minimize the effect on synchronization accuracy even if the pattern surface is set vertical. The variable pattern forming device can be, for example, a DMD (Digital Micromirror Device) including a plurality of reflecting elements driven based on the predetermined electronic data. The exposure apparatus with the DMD is disclosed, for example, in U.S. Patent Application Laid-Open No. 200710296936. Besides the reflection type spatial light modulators of the non-emission type like the DMD, it is also possible to use a transmission type spatial light modulator or a self-emission type image display device. The teachings of U.S. Patent Application Laid-Open No. 200710296936 above are incorporated herein by reference.

The foregoing embodiment used the micro fly's eye lens (fly's eye lens) of the wavefront division type with the plurality of microscopic lens faces as an optical integrator, but an optical integrator of an internal reflection type (typically, a rod type integrator) may also be used instead thereof. In this case, a condensing lens is arranged behind the zoom lens 7 for variation of σ so that its front focal position coincides with the rear focal position of the zoom lens 7, and the rod type integrator is arranged so that an entrance end thereof is positioned at or near the rear focal position of this condensing lens. In this case, an exit end of the rod type integrator is located at the position of the mask blind 11. When the rod type integrator is used, a position optically conjugate with the position of the aperture stop AS of the projection optical system PL in the imaging optical system 12 downstream this rod type integrator can be called an illumination pupil plane. A virtual image of the secondary light source on the illumination pupil plane is formed at the position of the entrance plane of the rod type integrator and, therefore, this position and positions optically conjugate with this position can also be called illumination pupil planes.

The exposure apparatus of the above embodiment is manufactured by assembling various sub-systems including the constituent elements described in the scope of claims in the present application so as to maintain predetermined mechanical accuracy, electrical accuracy, and optical accuracy. In order to ensure these various accuracies, the following adjustments are carried out before and after this assembling: adjustment for achieving the optical accuracy for various optical systems; adjustment for achieving the mechanical accuracy for various mechanical systems; adjustment for achieving the electrical accuracy for various electrical systems. Assembling blocks from the various sub-systems into the exposure apparatus include mechanical connection, wiring connection of electric circuits, pipe connection of pneumatic circuits, etc. between the various sub-systems. It is needless to mention that there are assembling blocks of the individual sub-systems, prior to the assembling blocks from these various sub-systems into the exposure apparatus. After completion of the assembling blocks of the various sub-systems into the exposure apparatus, overall adjustment is carried out so as to ensure the various accuracies as a whole of the exposure apparatus. The manufacture of the exposure apparatus may be carried out in a clean room in which the temperature, cleanliness, etc. are controlled.

Figure 12:
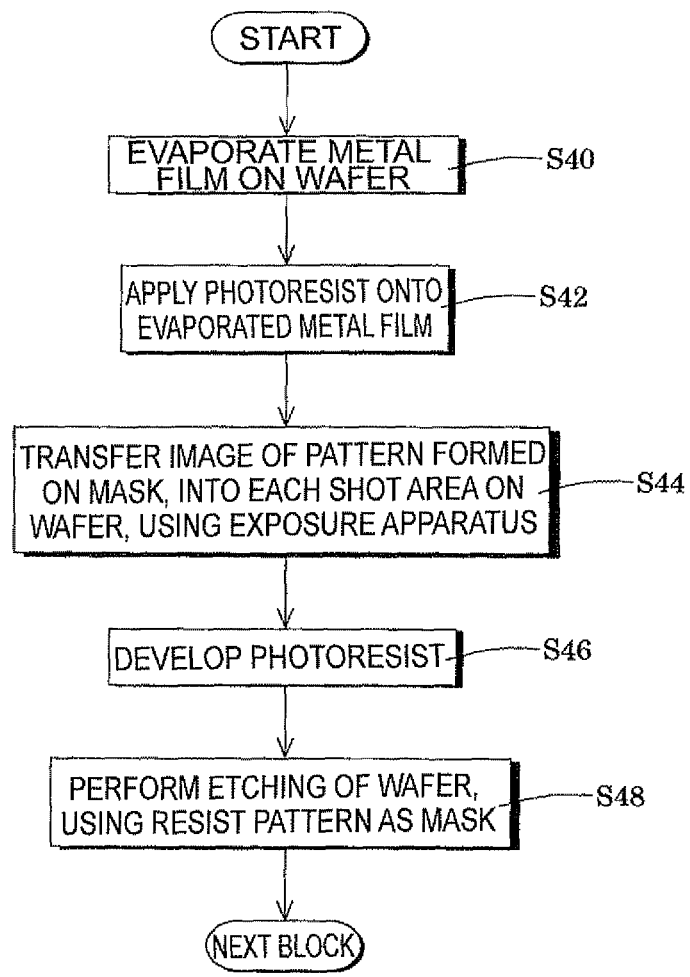
FIG. 12 is an exemplary flowchart showing manufacturing blocks of semiconductor devices.

The below will describe a device manufacturing method using the exposure apparatus of the above embodiment. FIG. 12 is an exemplary flowchart showing manufacturing blocks of semiconductor devices. As shown in FIG. 12, the manufacturing blocks of semiconductor devices include evaporating a metal film on a wafer W as a substrate for semiconductor devices (block S40), and applying a photoresist as a photosensitive material onto the evaporated metal film (block S42). Subsequently, using the exposure apparatus of the above embodiment, a pattern formed on a mask (reticle) M is transferred into each shot area on the wafer W (block S44: exposure block) and the block thereafter is to develop the wafer W after completion of the transfer, i.e., develop the photoresist on which the pattern is transferred (block S46: development block). Thereafter, using the resist pattern formed on the surface of the wafer W in block S46, as a mask, the surface of the wafer W is subjected to processing such as etching (block S48: processing block).

The resist pattern herein is a photoresist layer in which projections and depressions are formed in a shape corresponding to the pattern transferred by the exposure apparatus of the embodiment and through which the depressions penetrate. Block S48 is to process the surface of the wafer W through this resist pattern. The processing carried out in block S48 includes, for example, at least one of etching of the surface of the wafer W and film formation of a metal film or the like. In block S44, the exposure apparatus of the above embodiment performs the transfer of the pattern using the wafer W coated with the photoresist, as a photosensitive substrate or plate P.

Figure 13:
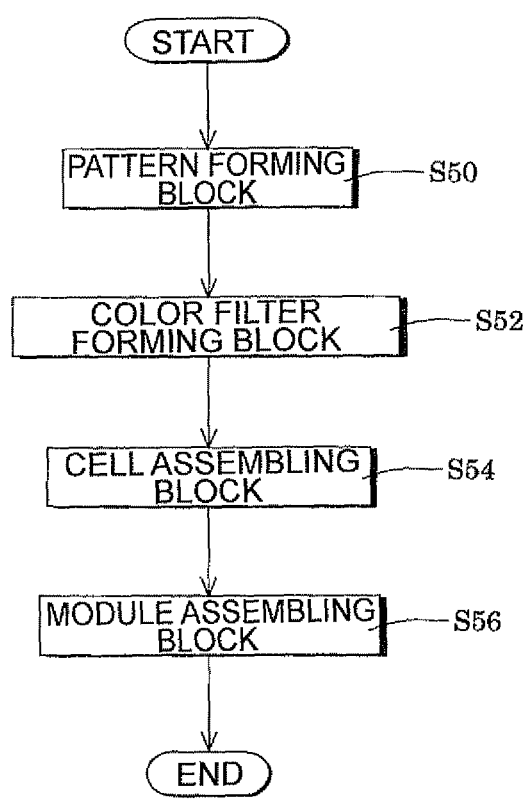
FIG. 13 is an exemplary flowchart showing manufacturing blocks of a liquid crystal device such as a liquid crystal display device.

FIG. 13 is an exemplary flowchart showing manufacturing blocks of a liquid crystal device such as a liquid crystal display device. As shown in FIG. 13, the manufacturing blocks of liquid crystal device are to sequentially carry out a pattern forming block (block S50), a color filter forming block (block S52), a cell assembling block (block S54), and a module assembling block (block S56). In the pattern forming block of block S50, a predetermined pattern such as a circuit pattern and an electrode pattern is formed on a glass substrate coated with a photoresist as a plate P, using the exposure apparatus of the above embodiment. This pattern forming block includes an exposure block of transferring the pattern onto the photoresist layer, using the exposure apparatus of the above embodiment, a development block of developing the plate P on which the pattern is transferred, i.e., developing the photoresist on the glass substrate to generate a photoresist layer in a shape corresponding to the pattern, and a processing block of processing the surface of the glass substrate through the developed photoresist layer.

In the color filter forming block of block S52, a color filter is formed in a structure in which a large number of sets of three dots corresponding to R (Red), G (Green), and B (Blue) are arrayed in a matrix pattern or in a structure in which a plurality of filter sets of three stripes of R, G, and B are arrayed in a horizontal scanning direction. In the cell assembling block of block S54, a liquid crystal panel (liquid crystal cell) is assembled using the glass substrate with the predetermined pattern formed in block S50, and the color filter formed in block S52. Specifically, for example, a liquid crystal is poured into between the glass substrate and the color filter to form the liquid crystal panel. In the module assembling block of block S56, various components such as an electric circuit and backlights for display operation of this liquid crystal panel are attached to the liquid crystal panel assembled in block S54.

The present embodiment is not limited to the application to the exposure apparatus for manufacture of semiconductor devices, but can also be widely applied to exposure apparatus for display devices such as liquid crystal display devices or plasma displays formed with rectangular glass plates, and to exposure apparatus for manufacture of various devices such as imaging devices (CCD and others), micromachines, thin film magnetic heads, and DNA chips. Furthermore, the present embodiments can also be applied to an exposure block (exposure apparatus) in manufacturing masks (photomasks, reticles, etc.) on which mask patterns for various devices are formed, by the photolithography process.

In the foregoing embodiment, it is also possible to apply a technique of filling the interior space of the optical path between the projection optical system and the photosensitive substrate with a medium having the refractive index of more than 1.1 (typically, a liquid), the so-called liquid immersion method. In this case, the technique of filling the interior space of the optical path between the projection optical system and the photosensitive substrate with the liquid can be one selected from the technique of locally filling the space with the liquid as disclosed in International Publication WO99/49504, the technique of moving a stage holding the substrate as an object to be exposed, in a liquid bath as disclosed in Japanese Patent Application Laid-Open No. H6-124873 above, the technique of forming a liquid bath in a predetermined depth on a stage and holding the substrate therein as disclosed in Japanese Patent Application Laid-Open No. H10-303114, and so on. The teachings of International Publication WO99/49504, Japanese Patent Application Laid-Open No. H6-124873, and Japanese Patent Application Laid-Open No. H10-303114 are incorporated herein by reference.

In the above embodiment, it is also possible to apply the so-called polarization illumination method as disclosed in U.S. Patent Application Laid-Open Nos. 2006/0170901 and 2007/0146676. The teachings of U.S. Patent Application Laid-Open Nos. 2006/0170901 and 2007/0146676 are incorporated herein by reference.

The above embodiment used the ArF excimer laser light (wavelength: 193 nm) or the KrF excimer laser light (wavelength: 248 nm) as the exposure light, but without having to be limited to this, it is also possible to apply the present embodiment to other appropriate laser light sources, e.g., an $F_2$ laser light source to supply laser light at the wavelength of 157 nm.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the disclosure described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present disclosure is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system that illuminates an illumination target surface with light from an optical outlet port of a light source, the illumination optical system comprising:
   a transmission optical system that guides the light from the light source onto a predetermined plane;
   an optical element having a plurality of optical surfaces each disposed on the predetermined plane; and
   a distribution forming optical system that forms a predetermined light intensity distribution on an illumination pupil of the illumination optical system, using light having traveled via the optical element,
   wherein the transmission optical system comprises:
      a dividing element that divides the light from the light source into a plurality of beams; and
      a condensing optical system that condenses the plurality of beams divided by the dividing element so that the plurality of beams partially overlap on the optical element, and
   wherein the condensing optical system keeps the optical outlet port and the predetermined plane in an optical Fourier transform relation.

2. The illumination optical system according to claim 1, wherein the dividing element is arranged at a position just behind the optical outlet port.

3. The illumination optical system according to claim 1, wherein the dividing element has a diffraction optical element.

4. The illumination optical system according to claim 3, wherein the diffraction optical element has such a diffraction characteristic as to form a beam with a cross section of a ring shape in the far field with incidence of a parallel beam.

5. The illumination optical system according to claim 3, wherein the diffraction optical element has such a diffraction characteristic as to form a beam with a cross section of a multi-polar shape in the far field with incidence of a parallel beam.

6. The illumination optical system according to claim 1, wherein the distribution forming optical system has an optical system that condenses light having traveled via the optical element, and an optical integrator arranged in an optical path of light condensed by the optical system that condenses the light having traveled via the optical element.

7. The illumination optical system according to claim 1, wherein the optical element has a diffraction optical element.

8. The illumination optical system according to claim 1, wherein the plurality of optical surfaces are controlled individually.

9. An exposure apparatus comprising the illumination optical system as set forth in claim 1 for illuminating a predetermined pattern, the exposure apparatus performing exposure of a photosensitive substrate with the predetermined pattern.

10. The exposure apparatus according to claim 9, further comprising a projection optical system which forms an image of the predetermined pattern on the photosensitive substrate,
   wherein an illumination pupil of the illumination optical system is a position optically conjugate with an aperture stop of the projection optical system.

11. A device manufacturing method comprising:
   performing the exposure of the photosensitive substrate with the predetermined pattern, using the exposure apparatus as set forth in claim 9;
   developing the photosensitive substrate on which the predetermined pattern is transferred, and forming a mask layer in a shape corresponding to the predetermined pattern on a surface of the photosensitive substrate; and
   processing the surface of the photosensitive substrate through the mask layer.

12. The illumination optical system according to claim 1, wherein the optical element comprises a spatial light modulator that emits a modulated light after spatially modulating an incident light.

* * * * *